(12) United States Patent
Ando et al.

(10) Patent No.: US 9,613,866 B2
(45) Date of Patent: Apr. 4, 2017

(54) GATE STACK FORMED WITH INTERRUPTED DEPOSITION PROCESSES AND LASER ANNEALING

(71) Applicant: INTERNATIONAL BUSINESS MACHINES CORPORATION, Armonk, NY (US)

(72) Inventors: Takashi Ando, Tuckahoe, NY (US); Aritra Dasgupta, Wappingers Falls, NY (US); Oleg Gluschenkov, Tannersville, NY (US); Balaji Kannan, Fishkill, NY (US); Unoh Kwon, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/155,474

(22) Filed: May 16, 2016

(65) Prior Publication Data
US 2017/0005003 A1   Jan. 5, 2017

Related U.S. Application Data

(62) Division of application No. 14/755,829, filed on Jun. 30, 2015.

(51) Int. Cl.
| | |
|---|---|
| H01L 21/20 | (2006.01) |
| H01L 21/8234 | (2006.01) |
| H01L 21/02 | (2006.01) |
| H01L 21/225 | (2006.01) |
| H01L 27/088 | (2006.01) |

(Continued)

(52) U.S. Cl.
CPC .. *H01L 21/823412* (2013.01); *H01L 21/0228* (2013.01); *H01L 21/02255* (2013.01); *H01L 21/2254* (2013.01); *H01L 21/823462* (2013.01); *H01L 21/823857* (2013.01); *H01L 27/088* (2013.01); *H01L 29/511* (2013.01); *H01L 29/513* (2013.01); *H01L 29/517* (2013.01); *H01L 29/518* (2013.01)

(58) Field of Classification Search
None
See application file for complete search history.

(56) References Cited

U.S. PATENT DOCUMENTS

| | | | |
|---|---|---|---|
| 6,660,660 B2 | 12/2003 | Haukka et al. | |
| 7,192,824 B2 * | 3/2007 | Ahn | C23C 14/08 257/E21.01 |
| 7,442,415 B2 | 10/2008 | Conley, Jr. et al. | |

(Continued)

OTHER PUBLICATIONS

"List of IBM Patents or Patent Applications Treated as Related" 1 page.
Specification "Gate Stack Formed with Interrupted Deposition Processes and Laser Annealing" and Drawings in related U.S. Appl. No. 14/755,829, filed Jun. 30, 2015, 37 pages.
Office Action for related U.S. Appl. No. 14/755,829 dated Jul. 18, 2016, 8 pages.

(Continued)

*Primary Examiner* — Minh-Loan Tran
(74) *Attorney, Agent, or Firm* — Steven Meyers; Andrew M. Calderon; Roberts, Mlotkowski Safran Cole & Calderon, P.C.

(57) ABSTRACT

Semiconductor structures and methods of fabricating the same using interrupted deposition processes and multiple laser anneals are provided. The structure includes a high-k gate stack with a high-k bilayer or nanolaminate where a bottom portion of the bilayer is crystallized while a top portion of the bilayer is amorphous.

13 Claims, 13 Drawing Sheets

(51) Int. Cl.
*H01L 29/51* (2006.01)
*H01L 21/8238* (2006.01)

(56) References Cited

U.S. PATENT DOCUMENTS

| | | |
|---|---|---|
| 7,666,752 B2 | 2/2010 | Kudelka et al. |
| 8,012,827 B2 | 9/2011 | Yu et al. |
| 8,017,182 B2 | 9/2011 | Hendriks et al. |
| 8,282,992 B2 | 10/2012 | Myo et al. |
| 8,828,836 B2 * | 9/2014 | Ramani .................. H01L 28/40 257/E21.008 |
| 2003/0104710 A1 | 6/2003 | Visokay et al. |
| 2003/0236001 A1 | 12/2003 | Shinriki et al. |
| 2005/0239297 A1 | 10/2005 | Senzaki et al. |
| 2013/0344692 A1 | 12/2013 | Triyoso et al. |

OTHER PUBLICATIONS

Clark et al., "Physical and Electrical Effects of the Dep-Anneal-Dep-Anneal (DADA) Process for HfO2 in High K/Metal Gate Stacks", The Electrochemical Society, 2011, 1 page (abstract).
Consiglio et al., "Engineering crystallinity of atomic layer deposited gate stacks containing ultrathin HfO2 and a Ti-based metal gate: Effects of postmetal gate anneal and integration schemes", J. Vac. Sci. Technol. B, May/Jun. 2014, 12 pages.
Notice of Allowance for related U.S. Appl. No. 14/755,829 dated Nov. 23, 2016, 8 pages.
List of IBM Patents or Patent Applications Treated as Related 1 page.

* cited by examiner

GATE STACK FORMED WITH INTERRUPTED DEPOSITION PROCESSES AND LASER ANNEALING

FIELD OF THE INVENTION

The invention relates to semiconductor structures and, more particularly, to semiconductor structures and methods of fabricating the same using interrupted deposition processes and laser annealing.

BACKGROUND

In increasing performance of a FET, it is known that gate dielectric reliability vs. Tinv scaling is a major industry trade-off. For example, increasing the thickness of a dielectric material stack increases reliability of the semiconductor device, but this increase in stack thickness will also decrease performance. Conversely, decreasing the thickness of a dielectric material stack can decrease reliability of the semiconductor device, but this decrease in stack thickness will also increase performance.

Also, as MOSFET devices are scaled down to less than 100 nanometers in gate or channel length, highly doped, shallow source and drain extension regions can be employed to achieve high drive current capability. The dopants are activated by conducting laser annealing or other millisecond-scale (mSec) annealing of the implanted extension regions either prior, during, or after a more conventional, second-scale Rapid Thermal Anneal (RTA).

SUMMARY

In an aspect of the invention, a structure comprises a high-k gate stack with a high-k bilayer or nanolaminate where a bottom portion of the bilayer is crystallized while a top portion of the bilayer is amorphous.

In an aspect of the invention, a method comprises a millisecond anneal to crystallize a lower portion of a high-k dielectric material with a top layer of the high-k dielectric material being amorphous, with restriction of a substrate preheat temperature during the millisecond anneal to below 600° C.

BRIEF DESCRIPTION OF THE DRAWINGS

The present invention is described in the detailed description which follows, in reference to the noted plurality of drawings by way of non-limiting examples of exemplary embodiments of the present invention.

FIG. 6(*b*) shows a FTIR spectra, comparing a high-k film fabricated using the processes of the invention (laser annealing) and structures fabricated using conventional fabrication processes.

DETAILED DESCRIPTION

The invention relates to semiconductor structures and, more particularly, to semiconductor structures and methods of fabricating the same using interrupted deposition processes and laser annealing. More specifically, the processes described herein rely on a technique of interrupted atomic layer deposition (ALD) of dielectric material with short-scale (laser) annealing processes. Even more specifically, in embodiments, the processes described herein integrate a high-k dielectric laser annealing with $La_2O_3$ deposition and diffusion processes allowing for significant improvements of negative bias temperature instability (NBTI) and positive bias temperature instability (PBTI) in high-k gate stack structures while providing a wide range of threshold voltage tunability.

Normally high-k gate oxides are formed by atomic layer deposition (ALD) processes followed by a post deposition (PDA) rapid thermal anneal (RTA) in order to improve the interfacial and bulk properties of the high-k material. The high-k film remains amorphous after RTA PDA conducted at ~700-800° C. The crystallization threshold RTA temperature depends on specific high-k materials used in the stack and is about 800° C.-850° C. for the ultrathin (<3 nm) hafnium oxide layers and is about 400° C.-500° C. for similar zirconium oxide layers, for instance. The threshold crystallization temperature is also high-k thickness dependent being higher for thinner high-k films. An amorphous gate dielectric material is considered to be desirable because the crystallization of high-k layers has multiple detrimental side effects. Crystallization releases excess oxygen atoms from the high-k film causing growth or thickening of the low-k interfacial layer.

Further, the crystalline high-k material has a higher speed of diffusion for oxygen atoms and oxygen vacancies allowing for their transport from transistor exterior to its channel region where they affects threshold voltage and uniformity of the interfacial layer. In addition, crystallization of high-k material causes surface roughness and material property variation between crystalline grains, which, in turn, results in non-uniform electrical fields in the channel region adjacent to the dielectric film. This, in turn, significantly degrades device performance. Further, a crystalline high-k film may have an enhanced gate leakage due to the presence of grain boundaries which serve as leakage paths. In general, the crystallization of high-k films in gate stacks is either avoided altogether or postponed until later in the process sequence when high-k layers are sealed mitigating detrimental effects caused by crystallization.

Figure 6:
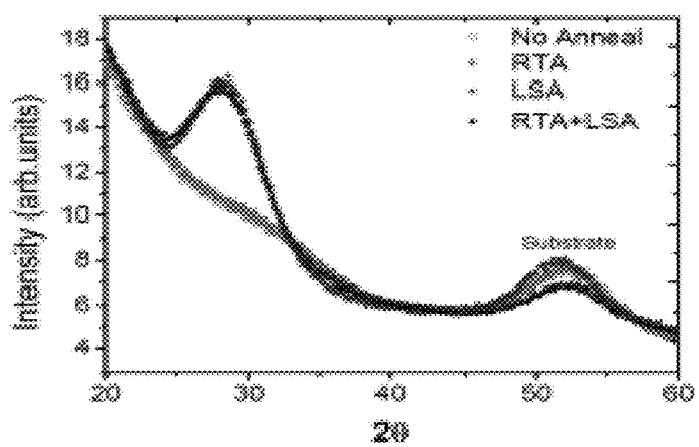
FIG. 6(*a*) shows a graph of XRD.
Figure 6:
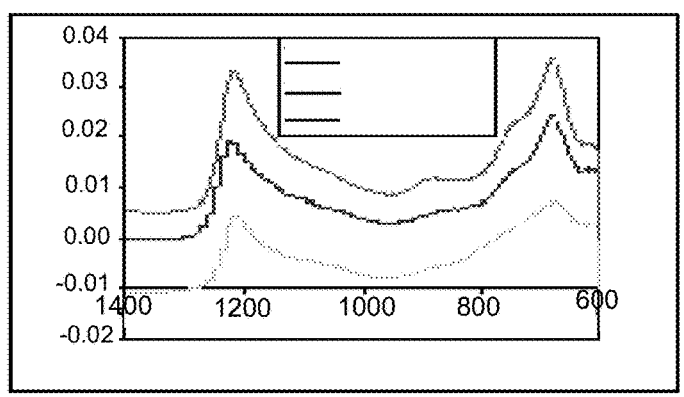
Figure 7:
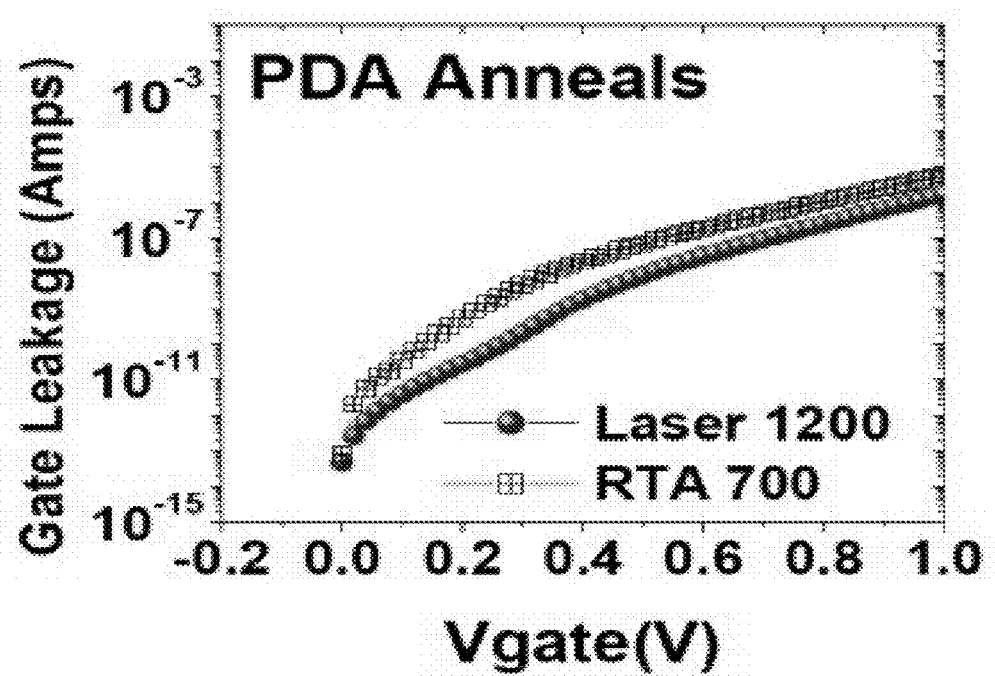
FIG. 7 shows a graph of gate leakage, comparing a structure fabricated using the processes of the invention (laser annealing) and structures fabricated using conventional fabrication processes (RTA anneals).
Figure 8:
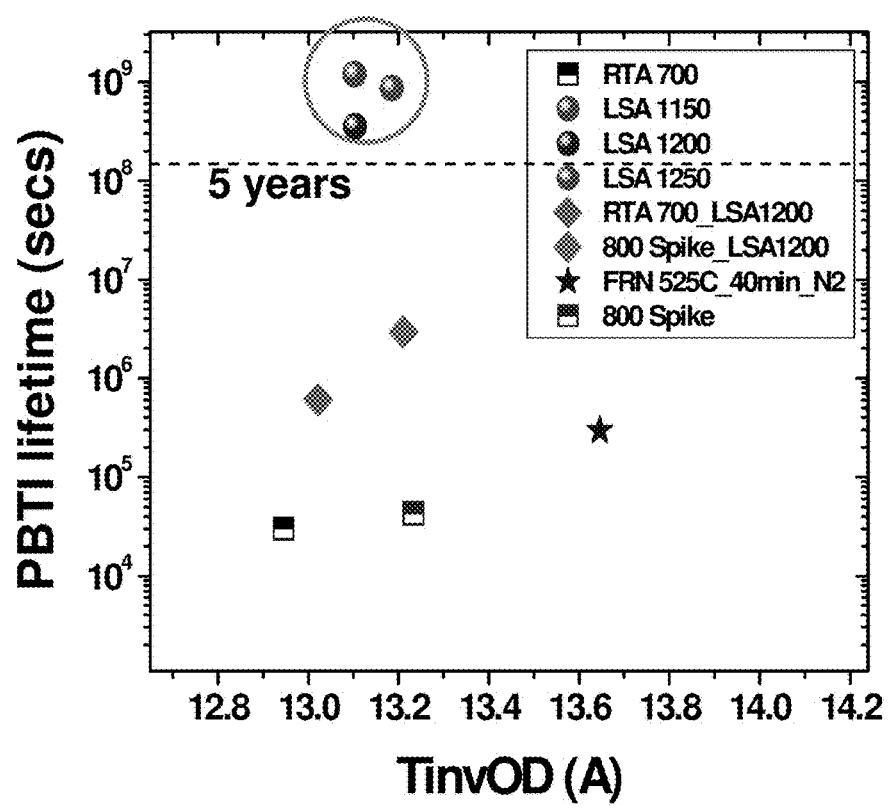
FIG. 8 shows a graph of NFET reliability (PBTI), comparing a gate stack structure fabricated using the processes of the invention (laser annealing) and structures fabricated using conventional fabrication processes (RTA anneals).
Figure 9:
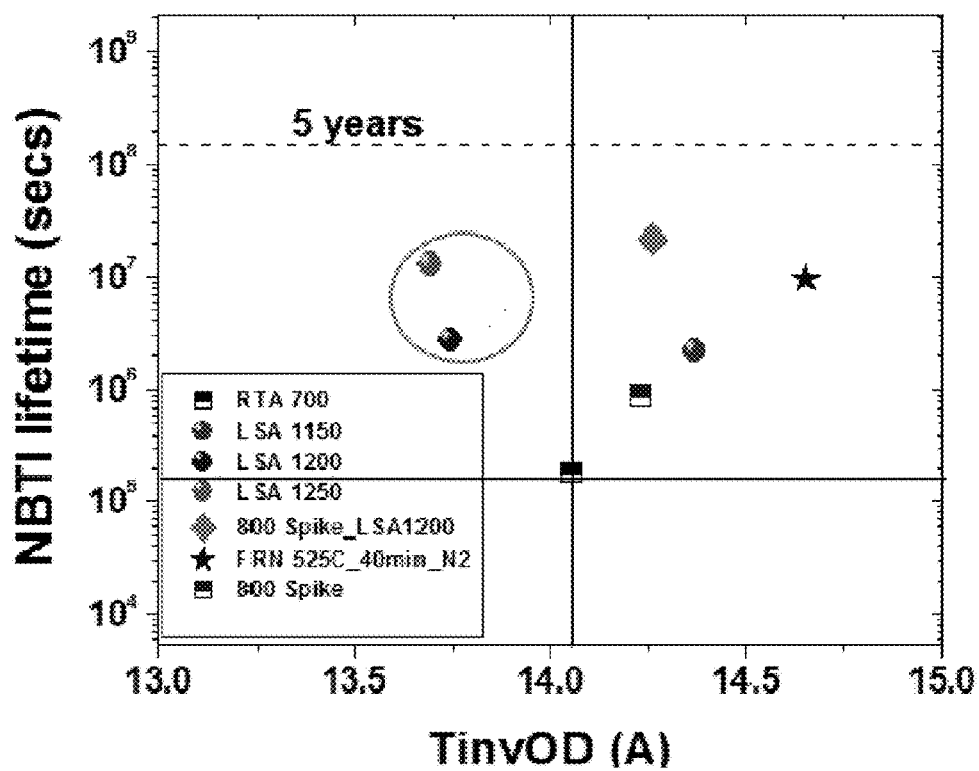
FIG. 9 shows a graph of PFET reliability (NBTI), comparing a gate stack structure fabricated using the processes of the invention (laser annealing) and structures fabricated using conventional fabrication processes (RTA anneals).
Figure 10:
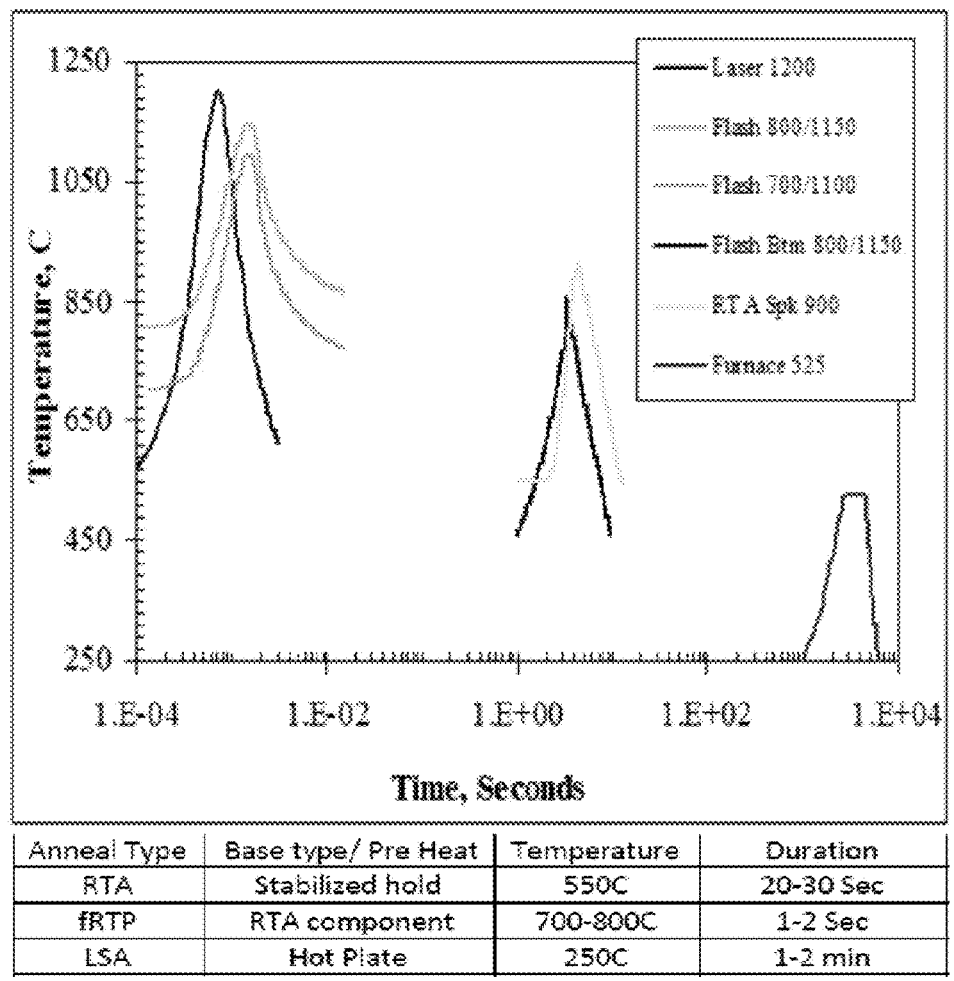
FIG. 10 shows thermal traces of different anneals: Laser, Flash, Flash pre-heat, Spike RTA & Furnace.

However, the inventors designed a millisecond Laser Anneal (LA) process for the PDA that crystallizes the high-k film as shown by the appearance of a XRD peak at 28 degrees as shown in FIG. 6(a). The millisecond LSA had a low base substrate temperature of about 250° C., ramp up and ramp down rates in excess of 1e5° C./sec, the peak temperature of 1200° C. and the duration of about 250 microseconds measured at 100° C. lower than the peak temperature. The width of XRD peak in FIG. 6(a) suggests the size of crystallites produced by millisecond LSA to be around 1.5-2 nm. The inventors also noted that the crystallization threshold temperature for the millisecond LSA was about 200-300° C. higher than the crystallization threshold temperature induced by RTA PDA. The high-k film crystallization is further confirmed by FTIR spectroscopy in FIG. 6(b) which shows a mixture of monoclinic and tetragonal phases in crystalline high-k film. The inventors discovered that this LSA PDA treated crystalline high-k film stack leads to lower gate leakage current compared to the amorphous high-k film of same effective electrical thickness, which is completely counterintuitive and unexpected. (See, e.g., FIG. 7.) Quite surprising to the inventors, this LSA PDA treated crystalline high-k film stack leads to superior gate stack reliability at scaled Tinv, relevant for sub-20 nm planar and FinFET technologies. The improved PBTI lifetimes (for NFETs) and NBTI lifetimes (for PFETs) at scaled Tinv is shown in FIG. 8 and FIG. 9. This further proves that the NBTI/PBTI lifetimes improve with the ramps rates of the different anneals used for high-k PDA. The ultra short millisecond-scale laser anneal showed best PBTI & NBTI reliability (highest lifetimes) compared to second-scale anneals like RTA and spike RTA and minute-scale furnace anneals. The thermal profiles of these anneals are shown in FIG. 10. Flash millisecond anneal (also labeled as "fRTP" in FIG. 10) has an RTA preheat component (labeled as "Flash Btm") as well as a millisecond spike anneal (labeled as "Flash"). The inventors also observed that the presence of high RTA preheat in flash annealing degrades NBTI/PBTI improvements obtained with LA PDA. Accordingly, the millisecond flash anneal can be used as an alternative millisecond PDA if its RTA preheat component is limited to below 600 C.

Doping the high-k material, on the other hand, provides other advantages such as tuning the effective work function (EWF) and associated threshold voltage of transistors. This, in turn, provides the ability to make multi-work function devices by intentionally varying concentration of high-k dopants. High-k stack doping with metallic elements such as La, Mg is known to be effective in altering or tuning EWF over the range of several hundred millivolts.

In order to make devices with multiple threshold voltages, Vt, for both logic FETs & SRAM FETs, a capping layer of lanthanum or magnesium containing material such as lanthanum oxide (La2O3), magnesium oxide (MgO) or similar oxides is selectively placed on top of the high-k dielectric film in before the metal gate deposition. These layers provide a source of the doping atoms that will form dipoles within the dielectric and its interfaces. In order to form these dipoles, the atoms are diffused through the dielectric layer and then react with or scavenge oxygen atoms of the dielectric layer. An annealing process is required for diffusing and reacting these atoms to form dipoles. The dipoles formed near the vicinity of semiconducting substrate such as at the high-k/SiOx or substrate/SiOx interfaces lead to a shift in a flatband voltage and an associated shift of threshold voltage Vt. Ability to induce larger flatband shifts is desirable since it enables forming transistors with a plurality of threshold voltages.

However, integrating the Vt-shift inducing doping technique and the laser-crystallized high-k film results in a much lower Vt shift (~70 mV) than that of the conventional RTA annealed amorphous high-k film gate stack (~200 mV). This reduces the threshold voltage tunability range for multi-Vt transistors. The inventors found that the laser-crystallized high-k film impedes the diffusion of dopant (e.g. La) through the high-k film compared to the case of conventionally annealed amorphous high-k film. To solve this problem, the processes described herein provide an interrupted or bilayer high-k deposition process whose top part is an amorphous high-k film and the bottom part is a crystalline high-k film.

Figure 11:
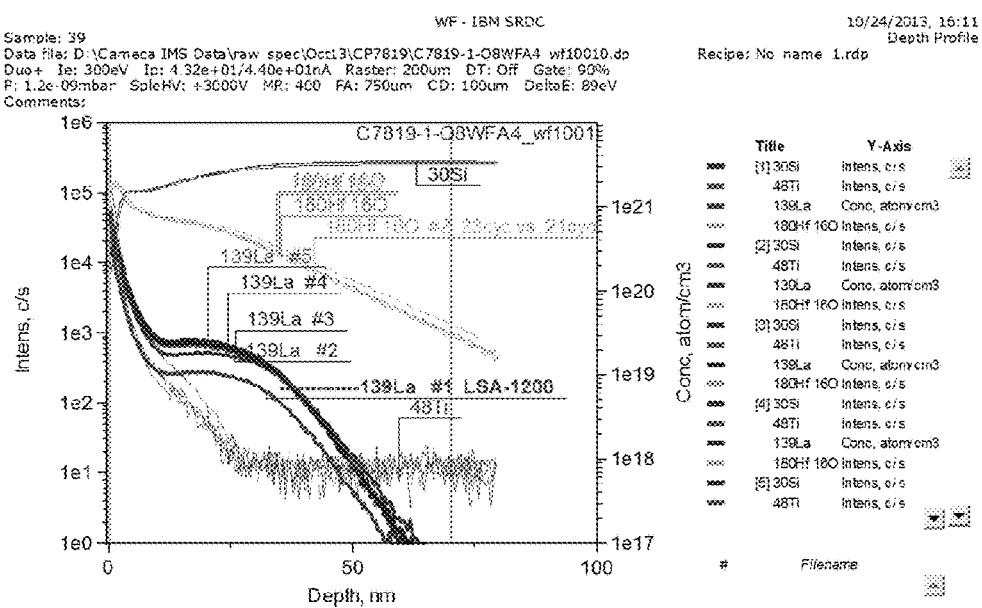
FIG. 11 shows a SIMS profile, with lanthanum (labeled "AO") diffusion comparing a high-k film fabricated using the processes of the invention (laser annealing) and structures fabricated using conventional RTA anneal fabrication processes.

FIG. 11 shows the SIMS profile of the laser-annealed and conventionally annealed high-k film. The amount of diffused La atoms is summarized in Table 1 and labeled as "SIMS AO". In Table 1, #1 labeled as "LA 1200" in the PDA column has deficient La due to LA induced recrystallization (see FIGS. 6(a) and (b)); whereas, #3 has normal La penetration by placing the LA annealing later to avoid high-k crystallization prior to Spike RTA drive-in step (column "Rel. anneal") and #2, #4, and #5 have La penetration similar to #3 while not using any millisecond annealing.

TABLE 1

5-Wafers_thinHiK_LSA_AO_2.xls 13162SD7001.013 FA9991 CP7819 A. Dasgupta

| Slot# | | Wafer id | IL | HK | PDA | AO | SIMS AO/ cm2 | Cap TiN | a-Si cap | Rel. anneal | cap TiN skip | PG patt wets | Late PDA | TF-XRD |
|---|---|---|---|---|---|---|---|---|---|---|---|---|---|---|
| 24 | 1 | Q8WFA4 | POR | 21cyc | LSA 1200 | 7x | 1.0E14 | 15A MO | POR | 970C Spike | | ver.C | | |
| 25 | 2 | Q7WFD5 | POR | 23cyc | RTA PDA | 7x | 1.71E14 | 15A MO | POR | 970C Spike | | ver. C | | |
| 22 | 3 | NJWFE4 | POR | 21cyc | skip PDA | 7x | 1.87E14 | 15A MO | POR | 970C Spike | | ver.C | LSA 1200 | |
| 23 | 4 | 1NIWFA2 | POR | 21cyc | skip PDA | 7x | 2.08E14 | 15A MO | POR | 970C Spike | | ver.C | | |
| 10 | 5 | 36TSEG6 | POR | 21cyc | RTA PDA | 7x | 1.92E14 | 15A MO | POR | 970C Spike | | ver. C | | |

The structures described herein can be manufactured in a number of ways using a number of different tools. In general, though, the methodologies and tools are used to form structures with dimensions in the micrometer and nanometer scale. The methodologies, i.e., technologies, employed to manufacture the structures described herein have been adopted from integrated circuit (IC) technology. For example, the structures of the present invention are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In accordance with aspects of the present invention, the structure also undergoes two annealing process as represented by the arrows in FIGS. 2 and 5.

Figure 1:
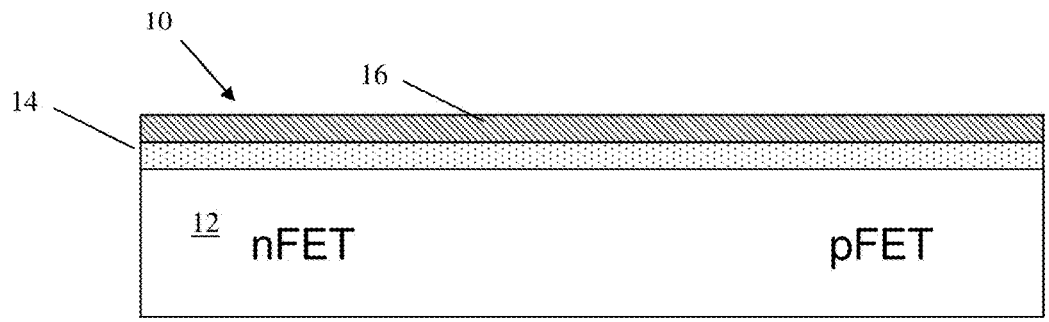
FIGS. 1-5 show fabrication processes and resultant structures in accordance with aspects of the invention.

More specifically, FIG. 1 shows a structure and respective fabrication processes in accordance with aspects of the invention. As shown in FIG. 1, the structure 10 includes an interfacial layer 14 formed over a substrate 12. In embodiments, the interfacial layer 14 can be a chemical oxide or oxynitride, deposited to a thickness of about 6 Å to 7 Å; although other thicknesses are contemplated herein, e.g., about 9 Å to 10 Å. The substrate 12 can include an nFET side and a pFET side, as an example. The substrate 12 can be any suitable semiconductor material including, but not limited to, Si, SiGe, SiGeC, SiC, Ge alloys, GaAs, InAs, InP, and other III/V or II/VI compound semiconductors. The semiconductor material of substrate 12 is lightly doped having doping polarity opposite to the FET type, e.g. a lightly doped n-type or p-type semiconducting material for pFET and nFET, respectively.

While the substrate 12 is drawn as a horizontal slab, it is equally representative of various three-dimensional transistors where the substrate 12 may be oriented differently and/or may have a different shape. Such three-dimensional, non-planar transistors include finFETs, surround-gate FETs, multiple-gate FETs, nano-wire or nano-sheet FETs, vertical FETs, and others. The substrate 12 can further include sidewall isolation structures and doped source and drain structures and metallic contacts that are not shown. The sequential order of making various useful elements that may exits in the substrate 12 can also be different. For instance, the source drain structures and isolation features can be formed prior to making interfacial layer 14. This approach is known as the replacement gate sequence.

In FIG. 1, a thin layer of dielectric material 16 is formed on the interfacial layer 14. In embodiments, the dielectric material 16 can be a high-k dielectric material such as hafnium based material (e.g., $HfO_2$) or zirconium based material ($ZrO_2$), as non-limiting examples of a high-k dielectric material. The dielectric material 16 can be formed using chemical vapor deposition (CVD) processes or an atomic layer deposition (ALD) processes over several cycles, e.g., 6 cycles to 25 cycles, resulting in a thickness of about 20 Å or less (noting that a single cycle results in a deposition thickness of about 0.75 Å).

There is a minimum number of cycles needed to make the film continuous because the film nucleates as islands and then, as the number of cycles increases, the islands coalesce forming a continuous layer. There is also a minimum number cycles needed to make the film uniform, a point at which the islands completely merge forming a uniform layer. With the continuous need to scale down gate dielectrics, the CVD/ALD deposition processes as well as the properties of the interfacial layer 14 are optimized to make a highly-uniform ultra-thin gate dielectric film with the lowest number of cycles. An optimized process runs at 1-4 cycles above the point where the film becomes completely uniform. 5-8 cycles are typically needed to make the film continuos. For instance, a state-of-the-art deposition process runs about 21 cycles yielding a highly uniform high-k layer of about 16 Å to 16.5 Å in thickness. The point at which thickness uniformity of the film degrades is about 17 cycles or about 13 Å to 13.5 Å in thickness. The point at which the film becomes discontinuous is about 5-8 cycles or about 3.5 Å to 6 Å in thickness.

Figure 2:
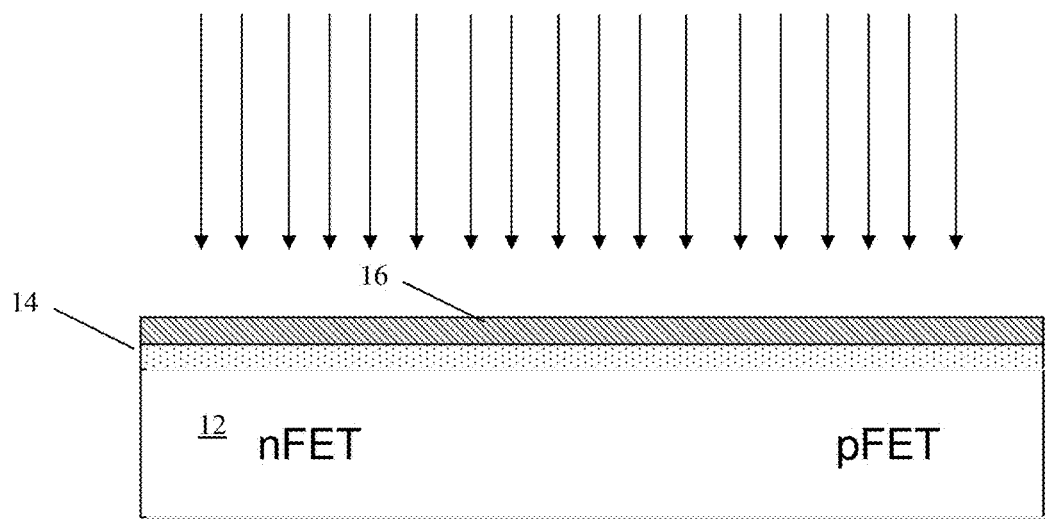
Figure 3:
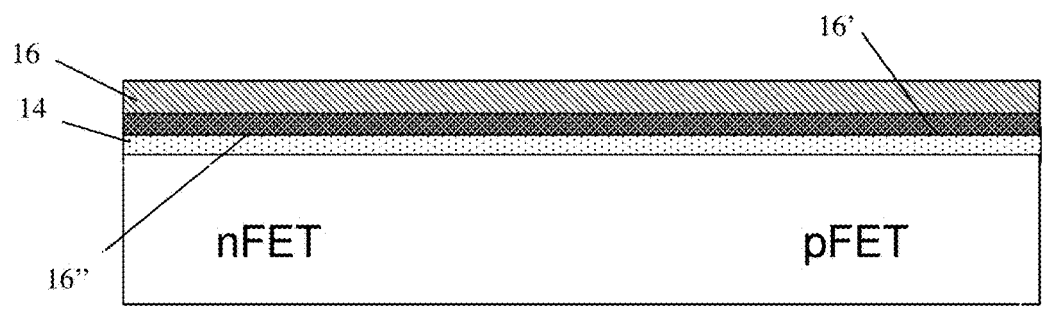

In accordance with the invention, as shown in FIG. 2, the deposition process of the high-k dielectric material 16 is interrupted (e.g., stopped between 6 to 15 cycles) to perform a laser anneal process. In one more specifically contemplated embodiment, the deposition process of the high-k dielectric material 16 is interrupted after the high-k film becomes continuos. In another specifically contemplated embodiment, the deposition process of the high-k dielectric material 16 is interrupted prior to the high-k film becomes fully uniform. That is, the interruption occurs between 6 cycles to 15 ALD cycles of depositing dielectric material 16 and a laser anneal is performed. More specifically, after the interruption of the ALD deposition of the dielectric material 16, the structure undergoes laser anneal on the order of about 100 to 3000 microseconds measured at 100° C. below temperature peak value at a peak temperature range of about 1000° C. to 1250° C. Preferred substrate base temperature is from the room temperature to about 500° C. with 150° C. to 300° C. being preferred. Preferred range of heat up and cool down rates is from about 1e4 to about 1e6° C./sec. In alternate embodiments, the anneal process can be a flash anneal with similar peak temperatures and durations. For the flash anneal, a low preheat temperature of below 550° C. is highly desirable.

As described above and shown in FIG. 6, the laser anneal process forms a crystalline high-k dielectric material resulting in a micro-crystallized layer 16' on top of the interfacial layer 14. The annealing process is followed by a second sequence of more cycles of high-k dielectric material 16. Thus, a bi-layer high-k dielectric stack, consisting of an amorphous high-k dielectric material 16 on top of crystalline high-k dielectric material 16' is formed. The electrical properties of the gate stack are governed by this bi-layer high-k dielectric stack (16, 16') and the interface 16" between the crystalline high-k film 16' and the interfacial layer 14. In embodiments, the dielectric material 16 can be high-k dielectric material such as a hafnium based material (e.g., $HfO_2$) or a zirconium based material ($ZrO_2$), as non-limiting examples of a high-k dielectric material. In embodiments, the high-k dielectric material 16 can be formed using chemical vapor deposition (CVD) process or an atomic layer deposition (ALD) process over several cycles, e.g., 6 cycles to 15 cycles, depending on a number of cycles used to form the high-k dielectric material 16'.

In one more specifically contemplated embodiment, the crystalline dielectric material 16' can be formed using ALD processes of 15 cycles (when the dielectric material 16 is formed in 6 cycles). In another more specifically contemplated embodiment, the crystalline dielectric material 16' can be formed using ALD processes over 11 cycles (when the dielectric material 16 is formed in 10 cycles). In embodiments, the total thickness of both the dielectric materials 16, 16" should be about 16 Å to 16.5 Å, e.g., on the order of 19 to 21 cycles total. In other embodiments, the total thickness of both the dielectric materials 16, 16" is selected to form a highly-uniform ultra-thin high-k layer.

Figure 4:
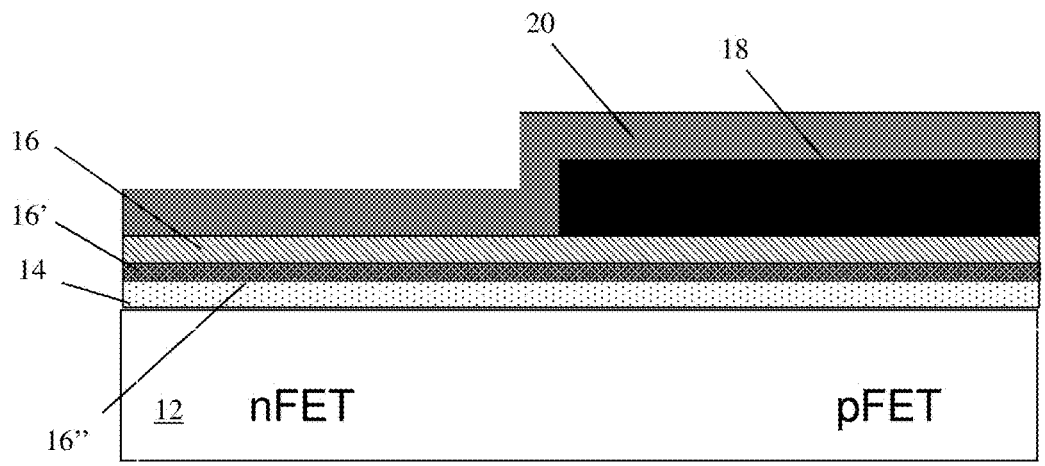

In FIG. 4, a blocking material 18 is deposited on the high-k dielectric material 16. In embodiments, the blocking material 18 can be, e.g., TiN, or a composite sandwich of TiN/oxide/TiN deposited to a thickness of about 35 Å to 50 Å on both the nFET side and the pFET side of the structure. It should be understood by those of skill in the art that other thicknesses are also contemplated by the present invention. The blocking material 18 can be deposited using a CVD or ALD process.

Still referring to FIG. 4, the blocking material 18 can be removed from the nFET side of the preselected devices to expose an upper surface of the high-k dielectric material 16. In embodiments, the blocking material 18 is removed using conventional lithography and etching processes. For example, a photoresist can be formed on blocking material 18 (not shown) which is then exposed to energy (light) through a mask to form a pattern. A reactive ion etching (RIE) is performed through the resist pattern to remove the blocking material 18 over the nFET side of the device, exposing a surface of the high-k dielectric material 16. Following reactive ion etching, the resist material is removed using an oxygen free resist ashing process.

Following the patterning, lanthanum oxide film ($La_2O_3$) 20 is deposited on the blocking material 18 and the exposed surface of the high-k dielectric material 16, on the nFET side of the preselected devices. In embodiments, a magnesium based material or other materials which form dipoles that shift Vt can be used in the processes described herein. In embodiments, the film 20 can be formed by ALD processes. In more specific embodiments, the $La_2O_3$ film 20 is deposited in 7 cycles of the ALD process.

Figure 5:
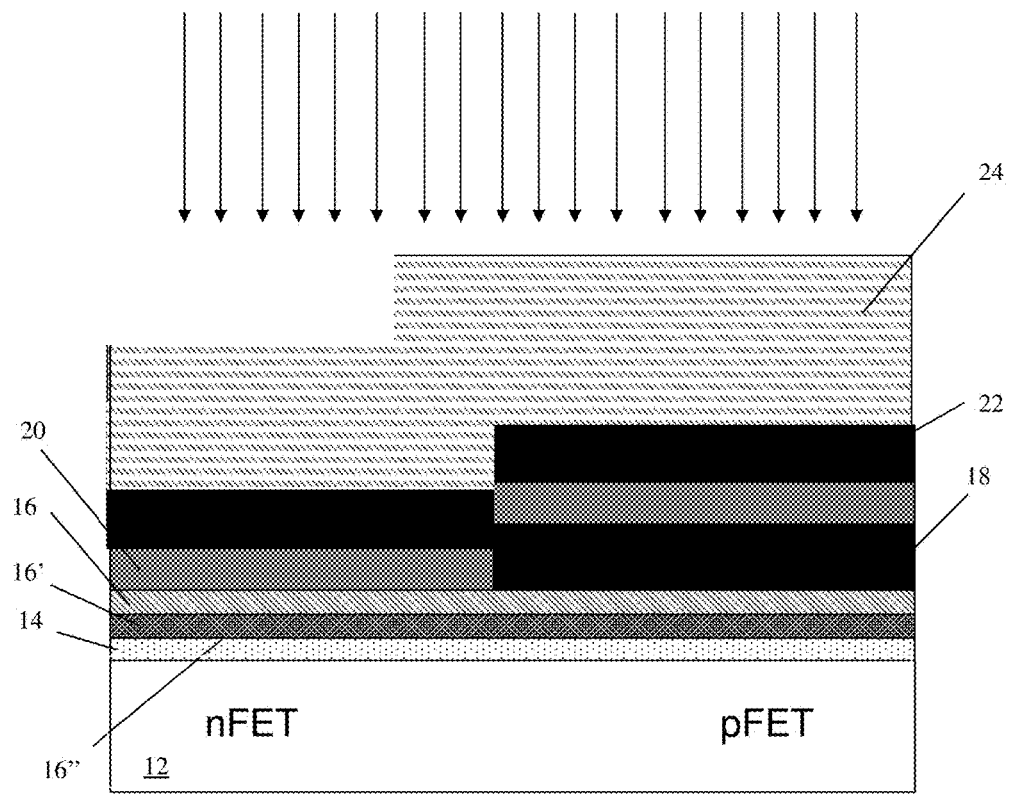

In FIG. 5, a capping layer 22 is formed over the film 20. In embodiments, the capping layer 22 is TiN, formed by a CVD or ALD process. In embodiments, the optional capping layer 22 will prevent the film 16 from crystallizing during subsequent annealing processes. Moreover, the optional capping layer 22 can protect the film 20 from interacting with the ambient of the subsequent annealing process during the subsequent annealing process.

An optional a-Si capping layer 24 is formed on the capping layer 22. In embodiments, the a-Si capping layer 24 can be deposited to a thickness of about 15 Å to about 20 Å using CVD processes. The a-Si capping layer 24 will prevent interaction between the capping layer 22 or capping layer 18 and the ambient of the subsequent annealing process. In this way, the a-Si capping layer 24 can prevent oxidation of the TiN films.

Still referring to FIG. 5, the structure undergoes an additional annealing process. More specifically, the annealing process includes a anneal, e.g., a triangular-shaped anneal with a ramp-up and ramp down rates of about 100° C./s and a duration of about two seconds at about 50° C. below the peak temperature. The peak temperature of such the anneal is from about 900° C. to about 1050° C. and the peak temperature of the laser anneal from about 1200° C. to about 1300° C. In embodiments, the annealing process will drive the lanthanum into the nFET side of the selected devices, e.g., toward the substrate 12, through the bilayer high-k dielectric material 16, 16' and toward the interface 16" between the HfOx and SiOx 14 and the interface between substrate interfacial layer 14 and the substrate 12, to form dipoles which shift the Vt for the nFET transistor; whereas, the blocking material 18 over the pFET area and unselected nFETs will prevent such diffusion of the lanthanum into this pFET transistors and unselected nFETs. In one more specifically contemplated embodiments, the anneal process parameters are selected to prevent crystallization of material 16 while enabling the drive-in process for La atoms and a reaction to form La-based dipole. This selection is afforded by the presence of capping layers 22, 24 that have an effect of shifting crystallization threshold for material 16 toward higher temperatures.

Advantageously and unexpectedly, the laser crystallizing anneal conducted while interrupting high-k deposition cycles improves gate leakage, negative-bias temperature instability (NBTI) and positive bias temperature instability (PBTI) of the gate stack; whereas, $La_2O_3$ attains lower nFET Vt and hence provides the ability to use multiple Vt nFET transistors while providing improved Tinv scaling and improved PBTI. In this way, it is possible to integrate $La_2O_3$ with the high-k dielectric crystallizing millisecond anneals to obtain the synergistic benefits of both processes.

Figure 12:
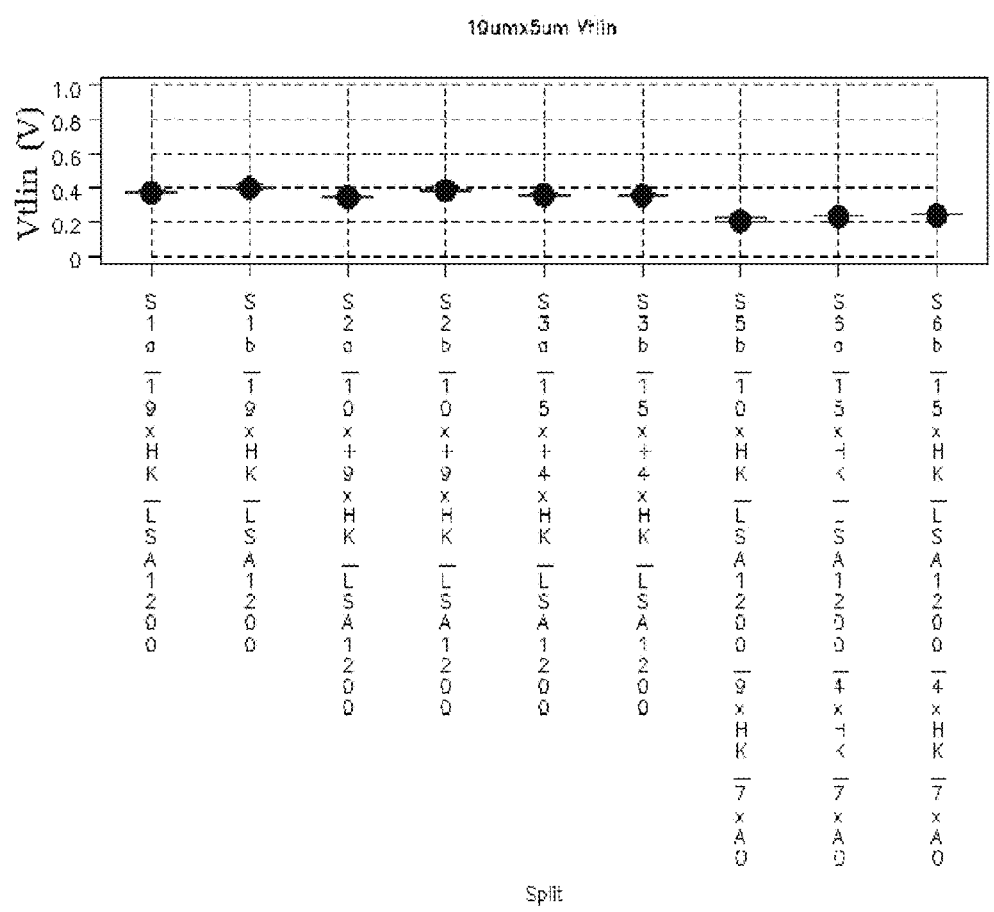
FIG. 12 shows the Vtlin graph comparing the structures fabricated using the processes of the invention and structures fabricated using conventional fabrication processes.

FIG. 12 shows a Vtlin graph comparing the structures fabricated using the processes of the invention and structures fabricated using conventional fabrication processes. The x-axis of the graph represents several different structures, with the last three structures, e.g., labeled S5b, S6a and S6b, implementing embodiments of the invention. The y-axis is Vtlin.

More specifically, the structures labeled S1a, S1b, S2a, S2b, S3a and S3b include the following conventional process parameters, respectively:

(i) 19 deposition cycles of high-k dielectric with a laser anneal (labeled LSA) at 1200° C.;

(ii) 19 deposition cycles of high-k dielectric with a laser anneal (labeled LSA) at 1200° C.;

(iii) 10 deposition cycles+9 deposition cycles of high-k dielectric with a laser anneal (labeled LSA) at 1200° C.;

(iv) 10 deposition cycles+9 deposition cycles of high-k dielectric with a laser anneal (labeled LSA) at 1200° C.;

(v) 15 deposition cycles+4 deposition cycles of high-k dielectric with a laser anneal (labeled LSA) at 1200° C.; and (vi) 15 deposition cycles+4 deposition cycles of high-k dielectric with a laser anneal (labeled LSA) at 1200° C.

The fabrication processes for the structures labeled S5b, S6a and S6b include the following process parameters, respectively:

(i) 10 deposition cycles of high-k dielectric, followed by a laser anneal (labeled LSA) at 1200° C.+9 deposition cycles of high-k dielectric, a laser anneal (labeled LSA) at 1200° C. and 7 cycles of $La_2O_3$;

(ii) 15 deposition cycles of high-k dielectric, followed by a laser anneal (labeled LSA) at 1200° C.+4 deposition cycles of high-k dielectric, and 7 cycles of $La_2O_3$; and (iii) 15 deposition cycles of high-k dielectric, followed by a laser anneal (labeled LSA) at 1200° C.+4 deposition cycles of high-k dielectric, and 7 cycles of $La_2O_3$.

As shown in FIG. 12, the processes labeled S1a, S1b, S2a, S2b, S3a and S3b show a Vtlin (in volts) of about 0.4 V, e.g., Vtlin of approximately 0.37-0.4 V. In comparison, the structures fabricated in accordance with processes of the present invention, e.g., labeled S5b, S6a and S6b, show a Vtlin of about 0.2 V. Accordingly, the inventors observed a significant Vtlin shift of the order of approximately 200 mV for an nFET device for the inventive method fully recovering La-induced threshold shift.

Figure 13:
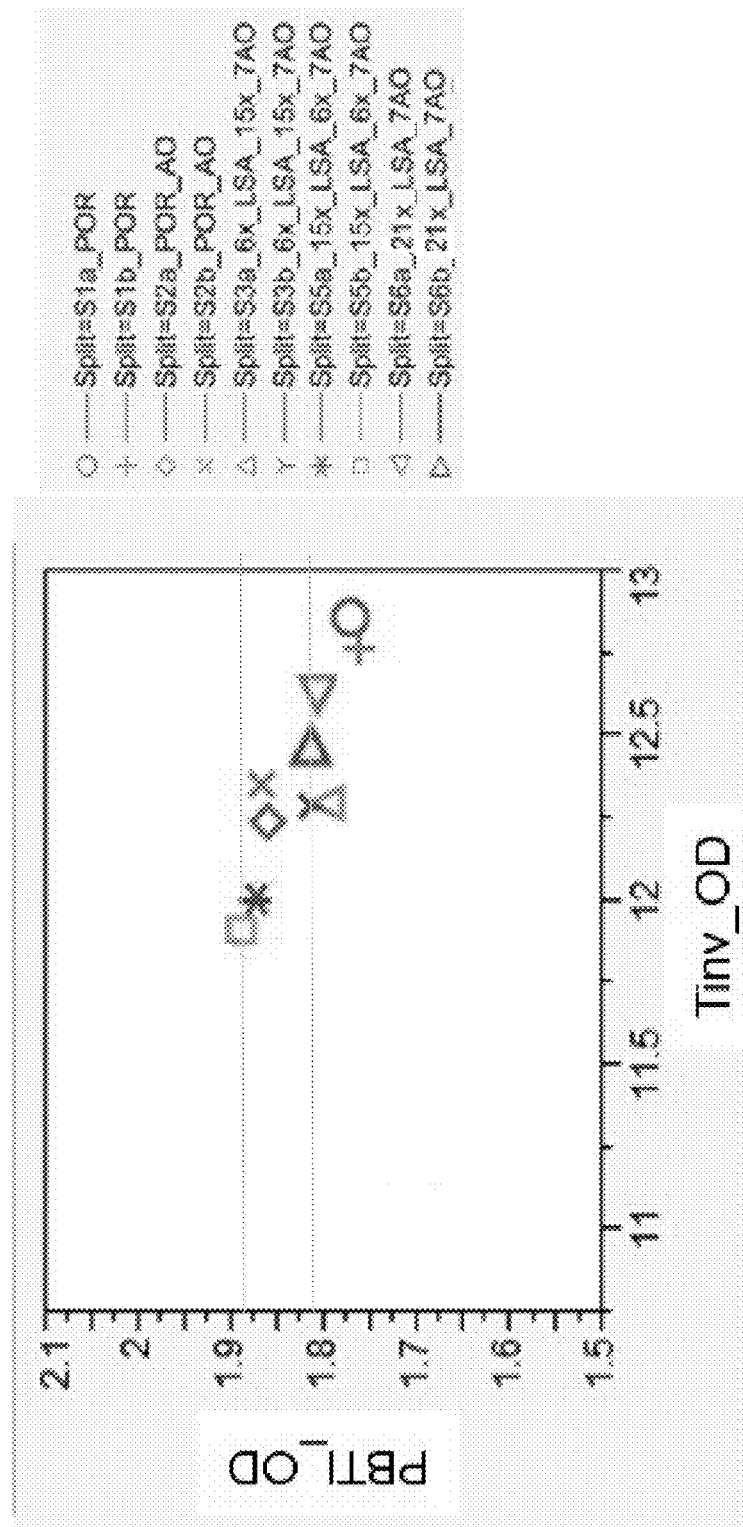
FIG. 13 shows a graph of device reliability (e.g., PBTI), comparing a structure fabricated using the processes of the invention and structures fabricated using conventional fabrication processes.

FIG. 13 shows a graph of NFET device reliability (e.g., PBTI), comparing a structure fabricated using the processes of the invention and structures fabricated using conventional fabrication processes. The y-axis shows PBTI and the x-axis shows Tinv. The structure labeled POR are processes of records, compared to the remaining processes which are provided in accordance with aspects of the invention. Clearly there is a significant improvement of the PBTI performance of the structures which implement embodiments of the invention, particularly S5a and S5b. So, for example, by implementing the processes of the present invention PBTI_OD (corrected for effective work function or EWF) is ~70-75 mV higher (better reliability) and at a lower Tinv (hence better transistor performance). Accordingly, it is shown that it is possible to combine additional PBTI benefits afforded by the crystallizing laser anneal with the La-based threshold voltage shift.

Figure 14:
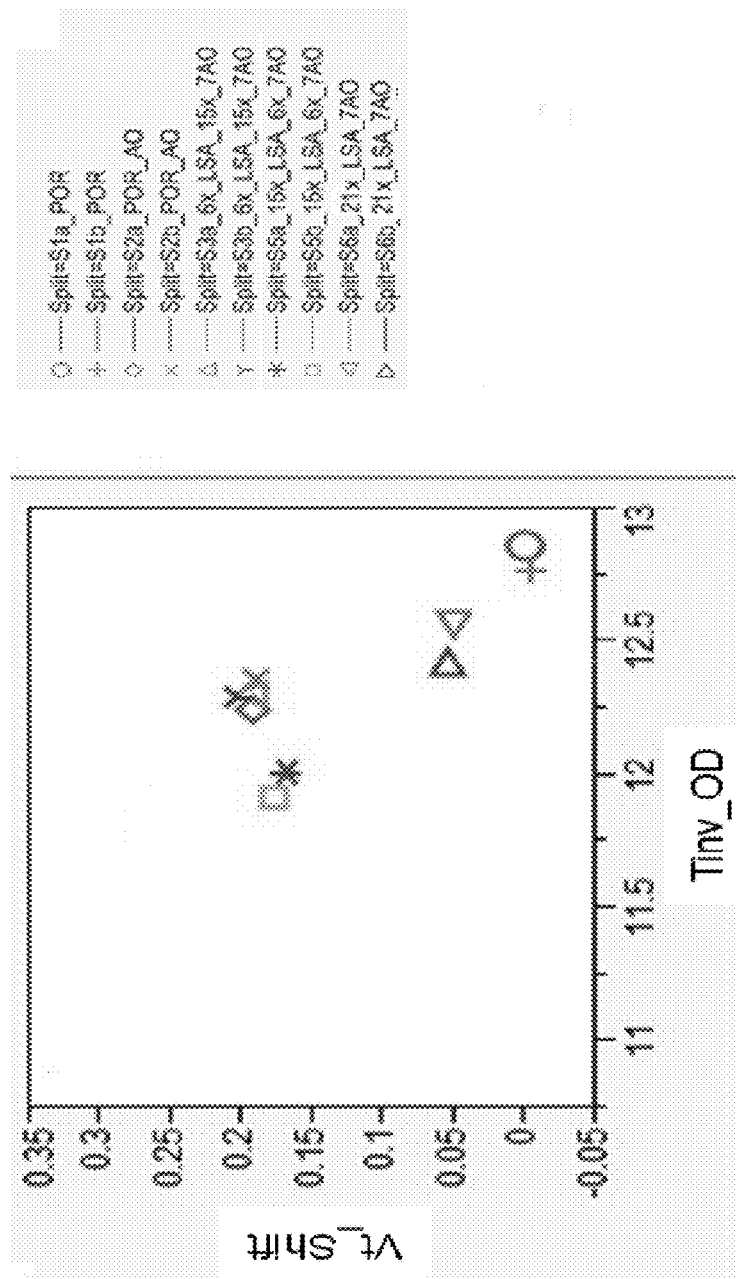
FIG. 14 shows a graph of device reliability (e.g., NFET Vt shift vs. TinvOD), comparing a structure fabricated using the processes of the invention and structures fabricated using conventional fabrication processes.

FIG. 14 shows a graph of NFET Vt shift vs. TinvOD, comparing a structure fabricated using the processes of the invention and structures fabricated using conventional fabrication processes such as non-crystallizing RTA anneals in the absence of La-containing material. As shown in FIG. 14, using the processes described herein, e.g., Split HK=HK1/ LSA PDA_1200° C./$HK_2$, it is possible to diffuse La to form dipoles at the SiOx/$HfO_2$ and SiOx/substrate interfaces and hence achieve Tinv scaling (e.g., hence better performance) and EWF reduction (for Multi WF devices). Also, using the processes described herein, it is possible to integrate the benefits of millisecond-scale crystallizing post deposition anneals (improved NBTI, PBTI, gate leakage) with La-induced work function shifts and Tinv electrical scaling.

Figure 15:
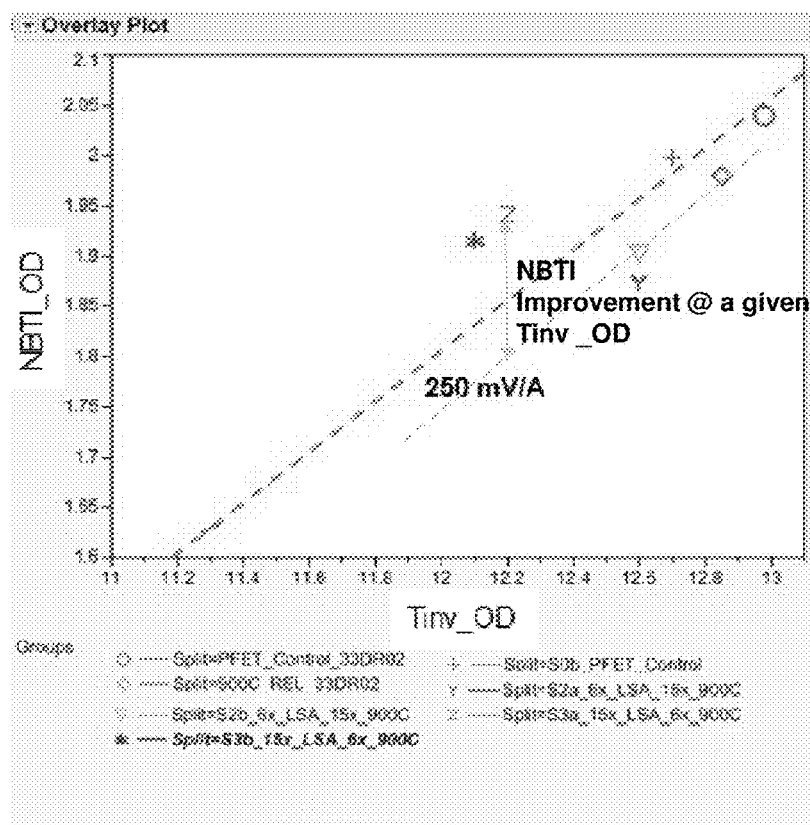
FIG. 15 shows a graph of device reliability (e.g., PFET Reliability: NBTI), comparing a structure fabricated using the processes of the invention and structures fabricated using conventional fabrication processes.

FIG. 15 shows a graph of pFET reliability, NBTI), comparing a structure fabricated using the processes of the invention and structures fabricated using conventional fabrication processes. For example, a split labeled S3a and S3b with 900° C. RTA drive-in anneal is shown to provide significantly better NBTI than the NBTI-Tinv trendline. Thus, the bilayer high-k dielectric and related gate stack formed using the inventive processes improves PFET reliability (NBTI) at a scaled Tinv even at a reduced drive-in temperature preventing additional high crystallization and allowing for improved transistor performance.

Accordingly, by using processes of the present invention, the following was observed: improved gate leakage at lower work function of the metal gate stack, lower Tinv, improved gate stack reliability (PBTI, NBTI) and breakdown voltage (VBD), thus showing significant performance and reliability gains on both FinFET and planar devices.

Accordingly, a synergistic effect in improvement of device performance with the integration processes described herein. For example, the inventors observed Vtlin shift of the order of approximately 200 mV for an nFET device as shown in FIG. 12 (last three cells, S5b & S6a & S6b), comparable to a device formed using conventional fabrication processes, e.g., using only a single drive-in RTA process for driving La from a capping layer of $La_2O_3$ film through amorphous high-k film.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising a millisecond anneal to crystallize a lower portion of a high-k dielectric material with a top layer of the high-k dielectric material being amorphous, with restriction of a substrate preheat temperature during the millisecond anneal to below 600° C.

2. The method of claim 1, wherein the millisecond anneal is a millisecond laser anneal.

3. The method of claim 1, wherein the millisecond anneal is from 100 to 3000 microseconds measured at 100° C. below temperature peak value at a peak temperature range of from 1000° C. to 1250° C.

4. The method of claim 1, further comprising depositing the high-k dielectric material in an interrupted atomic layer deposition (ALD) process with the millisecond anneal to crystallize the high-k dielectric material being performed during an interrupted cycle of the deposition of the high-k dielectric material.

5. The method of claim 4, further comprising diffusing La or Mg atoms into the high-k dielectric bi-layer.

6. The method of claim 5, further comprising creating multiple nFET transistors.

7. The method of claim 6, wherein the La or Mg is provided over select transistors, diffusing La/Mg atoms through the high-k dielectric bi-layer.

8. The method of claim 1, wherein the crystallizing of the lower portion of the high-k dielectric material is below 2 nm.

9. The method of claim 1, wherein a thickness of the crystallized lower portion of the high-k dielectric material is less than 12 Å.

10. The method of claim 9, wherein the high-k dielectric material contains La or Mg atoms.

11. The method of claim 10, wherein an amount of atoms of the La or Mg atoms is larger than 1.5e14 atoms/$cm^2$.

12. The method of claim 9, further comprising forming multiple nFET transistors where at least one of the nFET transistors has the La or Mg atoms.

13. The method of claim 9, wherein the La or Mg atoms will form dipoles by binding with oxygen.

* * * * *